(12) United States Patent
Hsieh et al.

(10) Patent No.: US 8,118,472 B2
(45) Date of Patent: Feb. 21, 2012

(54) FIXING STRUCTURE FOR PRINTED CIRCUIT BOARD OF BACKLIGHT MODULE

(75) Inventors: Chung-Chih Hsieh, Taipei (TW); Hui-Ju Hsu, Taichung County (TW); Tsao-Yuan Fu, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 358 days.

(21) Appl. No.: 12/437,551

(22) Filed: May 7, 2009

(65) Prior Publication Data
US 2010/0165642 A1    Jul. 1, 2010

(30) Foreign Application Priority Data
Dec. 25, 2008    (TW) ................................ 97150577 A

(51) Int. Cl.
*F21V 29/02* (2006.01)

(52) U.S. Cl. ................. 362/632; 362/633; 362/97.3

(58) Field of Classification Search ............... 362/97.1, 362/97.2, 249.02, 249.1, 249.11, 612, 613
See application file for complete search history.

(56) References Cited

U.S. PATENT DOCUMENTS

| | | | |
|---|---|---|---|
| 7,914,162 B1 * | 3/2011 | Huang | 362/92 |
| 7,922,364 B2 * | 4/2011 | Tessnow et al. | 362/294 |
| 7,980,717 B2 * | 7/2011 | Kim et al. | 362/97.2 |

FOREIGN PATENT DOCUMENTS

| | | |
|---|---|---|
| TW | 449243 | 8/2001 |
| TW | 553487 | 9/2003 |
| TW | M261729 | 4/2005 |
| TW | M305189 | 1/2007 |
| TW | I272888 | 2/2007 |
| TW | 200717077 | 5/2007 |
| TW | I287156 | 9/2007 |
| TW | M320687 | 10/2007 |
| TW | I289281 | 11/2007 |
| TW | 200811523 | 3/2008 |

* cited by examiner

*Primary Examiner* — Anabel Ton
(74) *Attorney, Agent, or Firm* — Winston Hsu; Scott Margo

(57) ABSTRACT

The present invention relates to a fixing structure for printed circuit board of backlight module. It includes a protective cover having at least one first supporting portion and the first supporting portion having a first protrusion; a printed circuit board having at least one pierce hole; and a back plate having at least one second supporting portion and the second supporting portion having a second protrusion, wherein the first supporting portion and the second supporting portion oppositely support the printed circuit board, the first protrusion and the second protrusion oppositely wedge in the pierce hole, and two copper areas respectively surround two ends of the pierce hole and electrically connect with the first supporting portion and the second supporting portion. The present invention economizes the cost of using screws and eliminates the static electricity from the printed circuit board of the backlight module.

16 Claims, 10 Drawing Sheets

FIXING STRUCTURE FOR PRINTED CIRCUIT BOARD OF BACKLIGHT MODULE

BACKGROUND OF THE INVENTION

1. Field of the Invention

The present invention relates to a fixing structure for printed circuit board of backlight module, which is used for the area of fixing an inverter or a control circuit board of a backlight module and eliminating static electricity from the inverter or the control circuit board of the backlight module.

2. Description of Related Art

The manufacturing technology of the film transistor liquid crystal display (TFT-LCD) is developed quickly and the TFT-LCD has advantages like lightness, thinness, economizing electrical power and non-radiation, etc. Hence, the TFT-LCD is widely used for the personal digital assistant (PDA), notebook, cell phone and television, etc. Because the TFT-LCD can't radiate light by itself, it needs light from the backlight module to display the picture. The FIG. 1 is a decomposed diagram of a liquid crystal display in the prior art. The liquid crystal display device 1 includes a frame 11, a liquid crystal panel 12 and a backlight module 13. The backlight module 13 includes an inverter 131 and a control circuit board 132; two protective cover 133 protecting the inverter 131 and the control circuit board 132 respectively; a back plate 134 and a plurality of lamps 135.

When the protective cover 133, the inverter 131 and the back plate 134 are assembled, at least one screw fixing hole 1311 of the inverter 131 is aimed at least one screw fixing hole 1341 of the back plate 134 and at least one screw fixing hole 1331 of the protective cover 133. Finally, a screw 14 is used for fixing the protective cover 133, the inverter 131 and the back plate 134. This screw fixing style avoids that the inverter 131 is shaken and rammed to cause the conducting wire take off (not shown in FIG. 1) so the lamps 135 is not brightened. This screw fixing style also avoids that the inverter 131 is broken. When the protective cover 133, the control circuit board 132 and the back plate 134 are assembled, at least one screw fixing hole 1321 of the control circuit board 132 is equally aimed at least one screw fixing hole 1341 of the back plate 134 and at least one screw fixing hole 1331 of the protective cover 133. Finally, a screw 14 is also used for fixing the protective cover 133, the control circuit board 132 and the back plate 134. Above screw fixing style has disadvantages like consuming manpower, consuming equipment, consuming time and consuming cost, so as to reduce competition of the product. Furthermore, when the inverter or the control circuit board is operated, the static electricity accumulated phenomenon happens. Hence, the inverter or the control circuit board will be damaged. Above screw fixing style can't avoid static electricity accumulated phenomenon.

Hence, the present invention provides a fixing structure for printed circuit board of backlight module. It doesn't need the screw to lock so it can improve disadvantages like consuming manpower, consuming equipment, consuming time and consuming cost, so as to increase competition of the product. Furthermore, the present invention can eliminate static electricity from the inverter or the control circuit board to avoid its damage.

SUMMARY OF THE INVENTION

The main objection of the present invention is to provide a fixing structure for printed circuit board of backlight module. It can economize the manpower, equipment, time and cost of the screw locking style to increase the competition of the product.

The other objection of the present invention is to provide a fixing structure for printed circuit board of backlight module. It can eliminate static electricity from the printed circuit board (like inverter or control circuit board) in the backlight module to avoid its damage.

The fixing structure for printed circuit board of backlight module includes a protective cover having at least one first supporting portion on its surface, the first supporting portion having a first protrusion; a printed circuit board having at least one pierce hole; and a back plate having at least one second supporting portion, the second supporting portion having a second protrusion; wherein the printed circuit board is deposed between the protective cover and the back plate, the first supporting portion and the second supporting portion oppositely support the printed circuit board, the first protrusion and the second protrusion oppositely wedge in the pierce hole, two copper areas respectively surround two ends of the pierce hole and electrically connect with the first supporting portion and the second supporting portion.

In order to make the aforementioned objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and together with the description, serve to explain the principles of the invention.

DESCRIPTION OF PREFERRED EMBODIMENTS

First Preferred Embodiment

Figure 1:
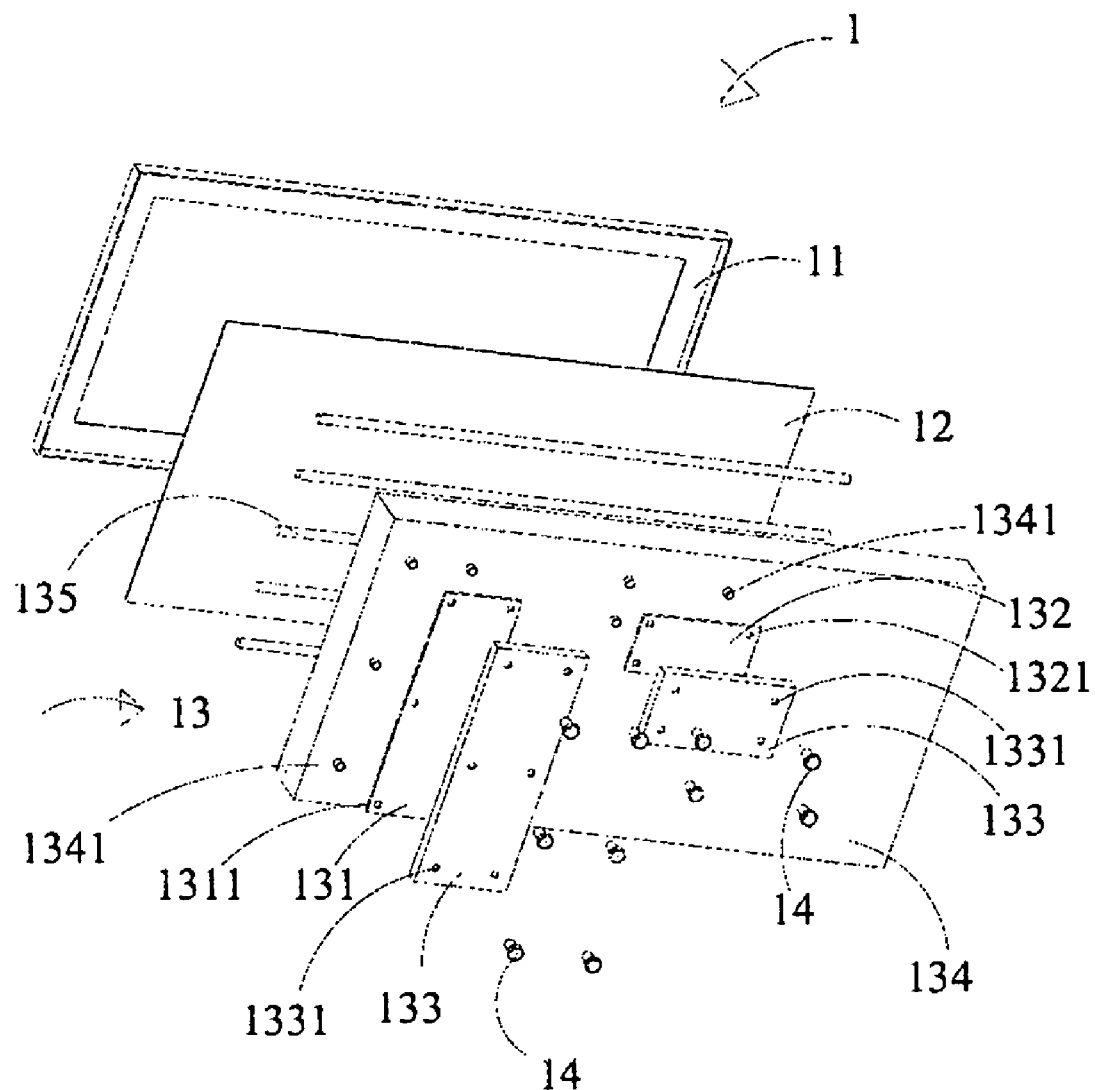
FIG. 1 is a decomposed diagram of a liquid crystal display in the prior art.
Figure 2:
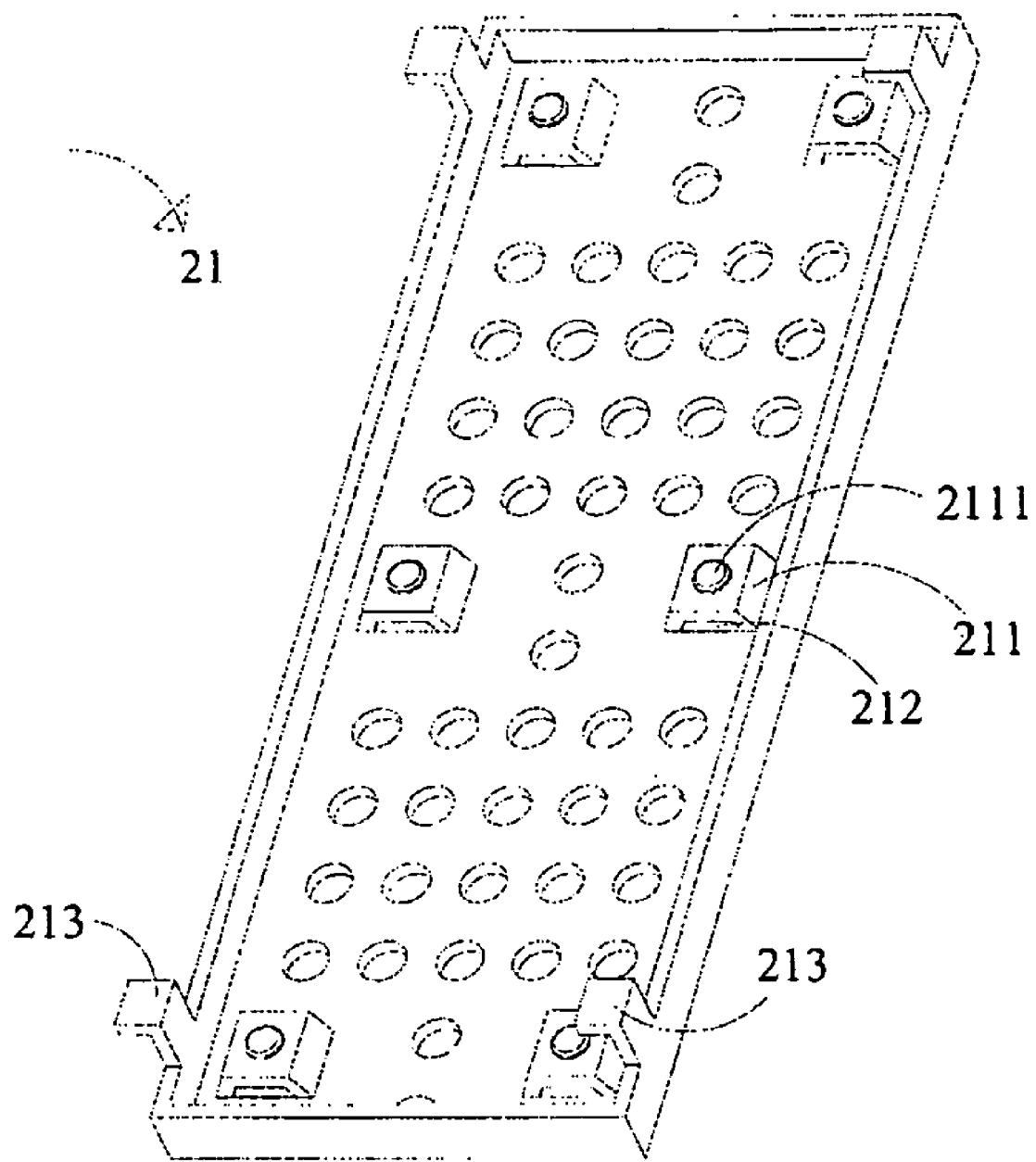
FIG. 2 is a drawing for a protective cover of a fixing structure for printed circuit board of backlight module of a first preferred embodiment in the present invention.
Figure 3:
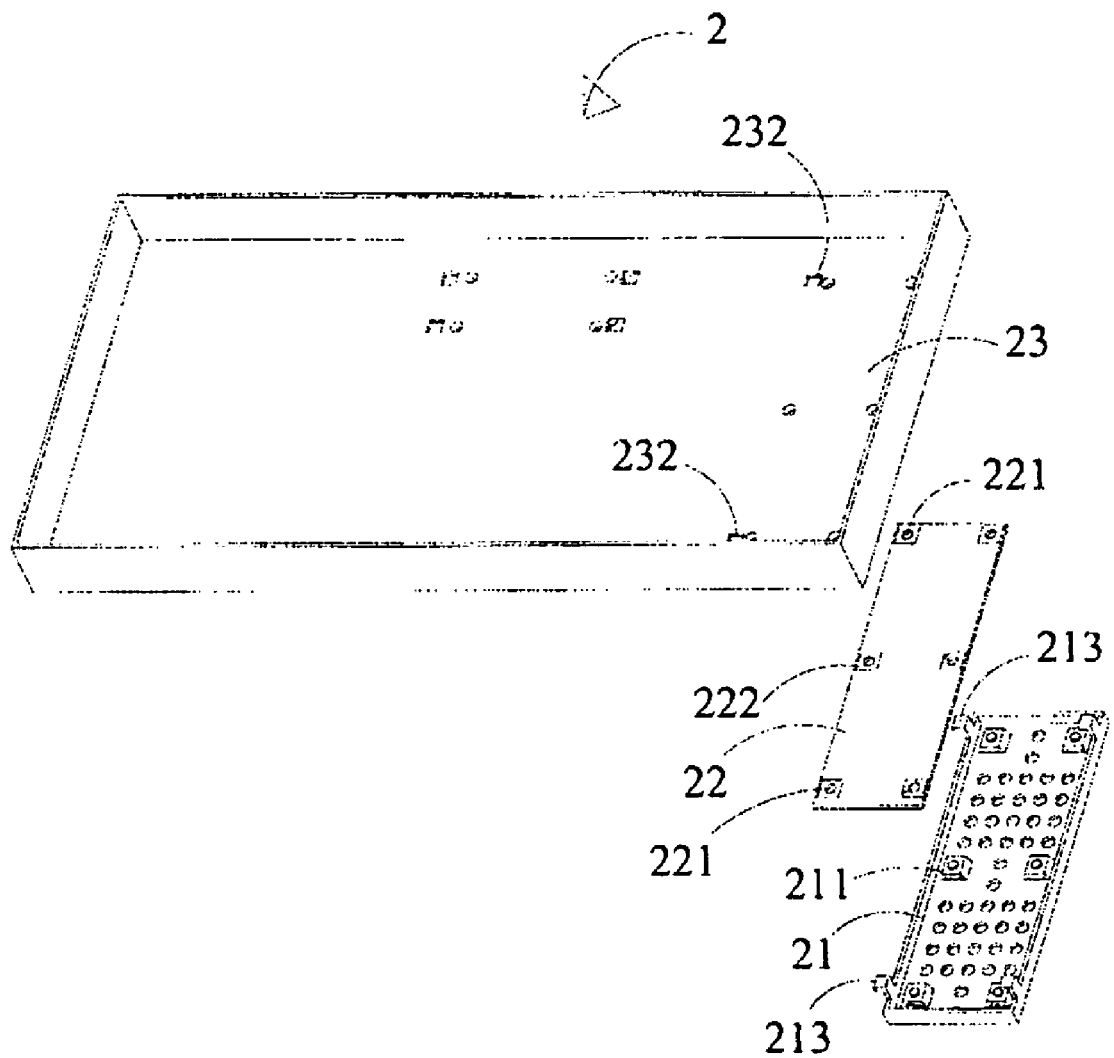
FIG. 3 is a decomposed diagram of the fixing structure for printed circuit board of backlight module of the first preferred embodiment in the present invention.
Figure 4:
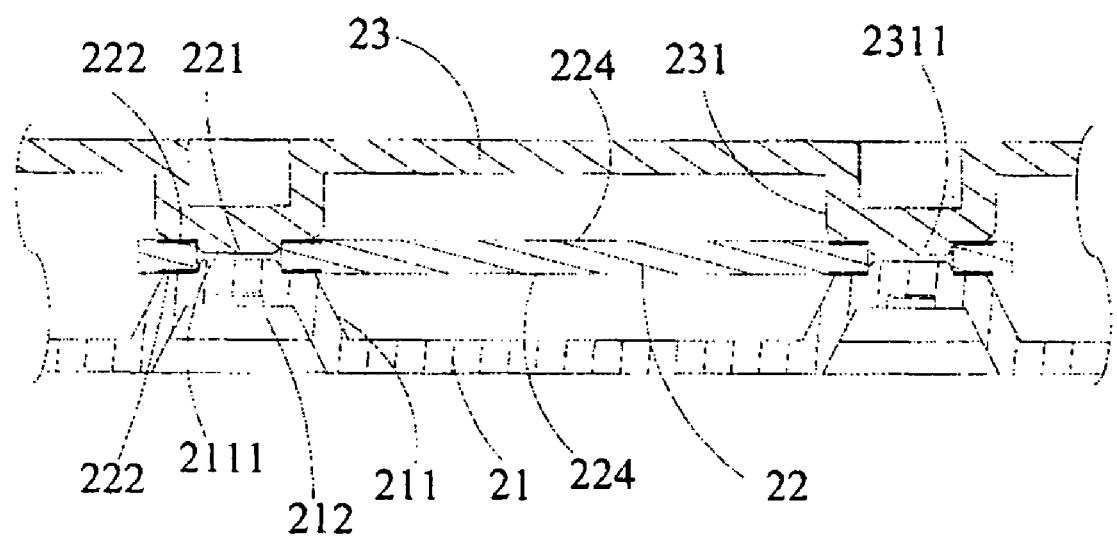
FIG. 4 is a cross-section view of a portion of the fixing structure for printed circuit board of backlight module of the first preferred embodiment in the present invention.

Firstly, please refer to the FIG. 2 to FIG. 4. A fixing structure for printed circuit board of backlight module 2 of the present invention includes a protective cover 21, which has at least one first supporting portion 211 on its surface. The shape of the first supporting portion 211 is a bridge shape and the first supporting portion 211 is formed by punching the protective cover 21. A slot 212 is formed between the first supporting portion 211 and the surface of the protective cover 21 that can increase the air convection and take away the heat. The first supporting portion 211 has a first protrusion 2111. The first supporting portion 211 and the first protrusion 2111 are as a whole body. Two opposite sides of the protective cover 21 respectively extend at least one L shape fixing element 213, the L shape fixing element 213 of one side of two opposite sides of the protective cover 21 and the L shape fixing element 213 of the other side of two opposite sides of the protective cover 21 have the same directions. Two opposite sides of an inverter 22 respectively have at least one pierce hole 221. A back plate 23 has at least one second supporting portion 231, which is formed by pressing the back plate 23. The second supporting portion 231 has a second protrusion 2311. The second supporting portion 231 and the second protrusion 2311 are as a whole body. Furthermore, the back plate 23 has at least one fixing hole 232, which corresponds to the L shape fixing element 213. When the protective cover 21, the inverter 22 and the back plate 23 are fixed, the inverter 22 is deposed between the protective cover 21 and the back plate 23. The first supporting portion 211 and the second supporting portion 231 oppositely support the inverter 22 that avoids the inverter 22 short due to a circuit area 224 of the inverter 22 touching with the protective cover 21 and the back plate 23. The first protrusion 2111 and the second protrusion 2311 oppositely wedge in a pierce hole 221 of the inverter 22 and two copper areas 222 respectively surround two ends of the pierce hole 221. Because the protective cover 21 and the back plate 23 are made of alloys, the two copper areas 222 respectively electrically connect with the first supporting portion 211 and the second supporting portion 231, so as to attain to ground connection to eliminate static electricity from the inverter 22.

Figure 5A:
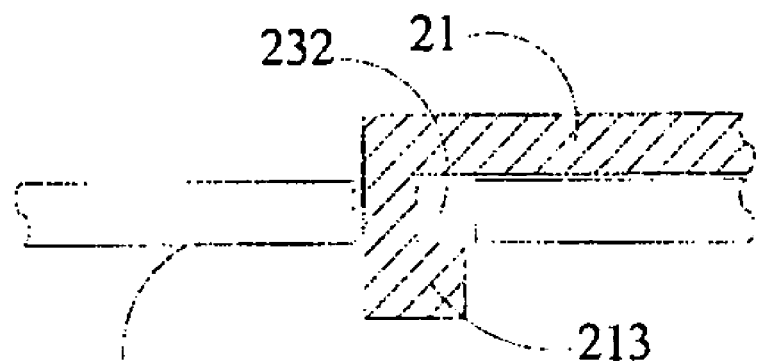
FIG. 5A is a schematic diagram of a L shape fixing element inserted in a fixing hole of the first preferred embodiment in the present invention.
Figure 5B:
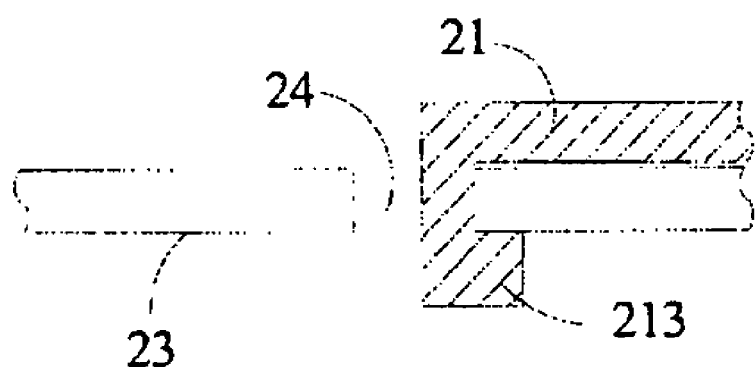
FIG. 5B is a schematic diagram of the L shape fixing element removed of the first preferred embodiment in the present invention.
Figure 5C:
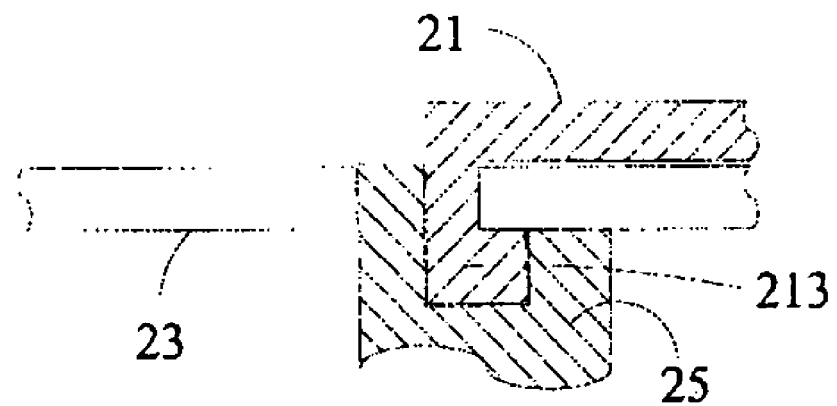
FIG. 5C is a schematic diagram of the L shape fixing element wedged in the fixing hole and a gap filled of the first preferred embodiment in the present invention.

Please refer to the FIG. 5A to FIG. 5C. When the protective cover 21, the inverter 22 and the back plate 23 is fixed, the L shape fixing elements 213 of two opposite sides of the protective cover 21 are respectively inserted in the fixing holes 232 of two opposite sides of the back plate 23. Then, the protective cover 21 is removed to make the L shape fixing elements 213 wedged in the fixing holes 232. Hence, a gap 24 is formed between the L shape fixing elements 213 and a wall of the fixing holes 232. Then, the filling material 25 fills the gap 24 to make the protective cover 21 and the back plate 23 fixed sufficiently.

Second Preferred Embodiment

Figure 6:
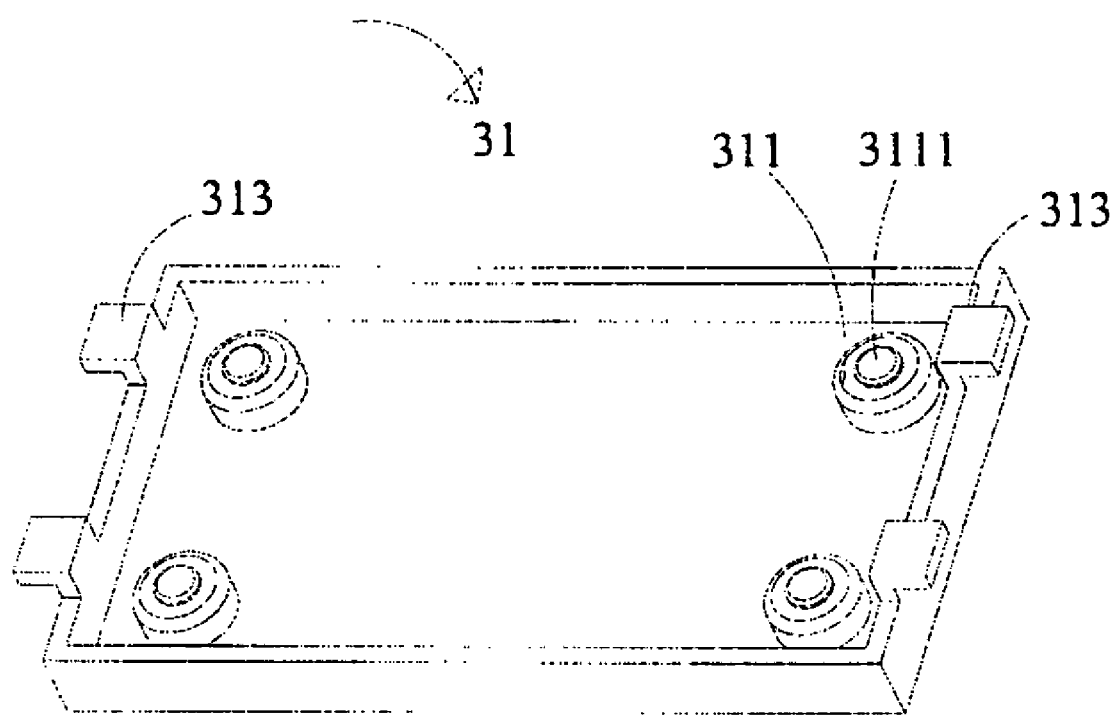
FIG. 6 is a drawing for a protective cover of a second preferred embodiment in the present invention.
Figure 7:
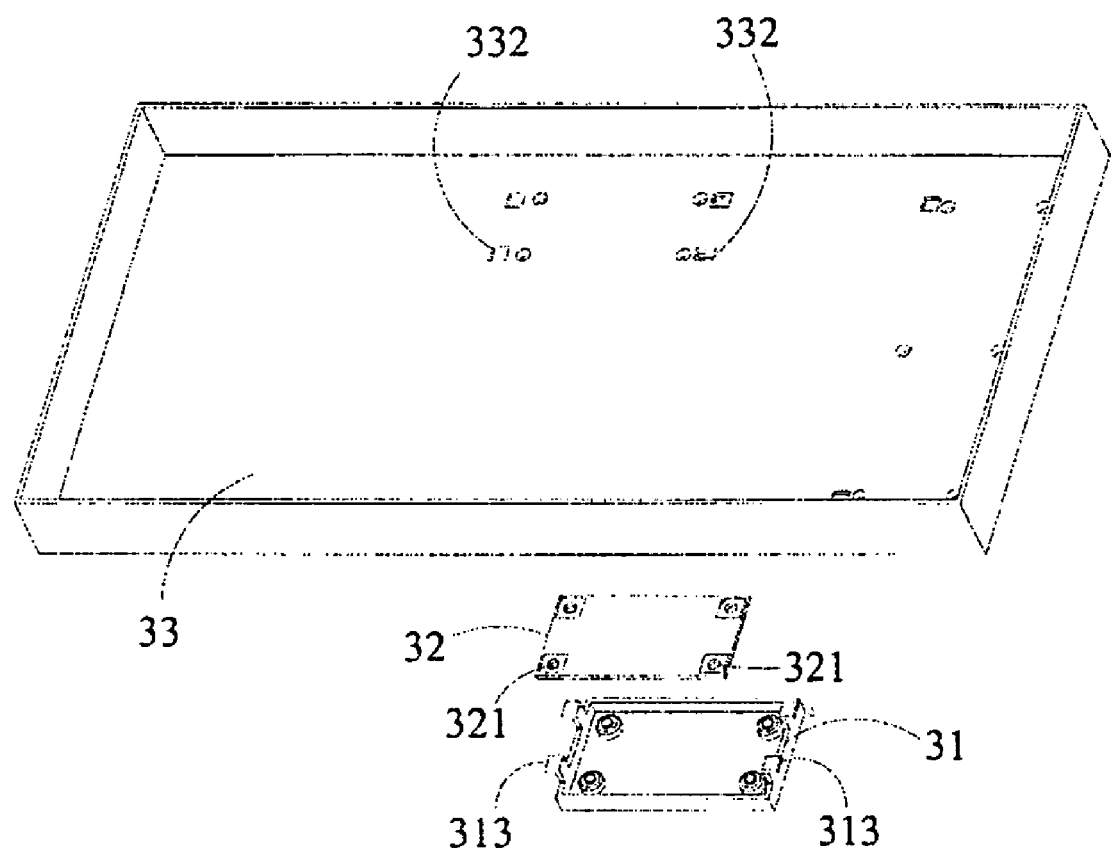
FIG. 7 is a decomposed diagram of a fixing structure for printed circuit board of backlight module of the second preferred embodiment in the present invention.
Figure 8:
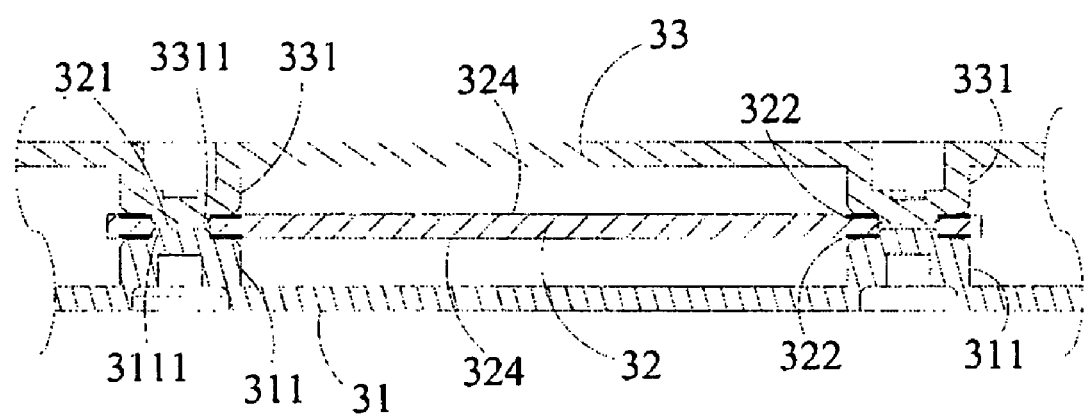
FIG. 8 is a cross-section view of a portion of the fixing structure for printed circuit board of backlight module of the second preferred embodiment in the present invention.

Please refer to the FIG. 6, FIG. 7 and FIG. 8. The fixing structure for printed circuit board of backlight module 3 of the present invention includes a protective cover 31, which has at least one first supporting portion 311 on its surface. The shape of the first supporting portion 311 is a pillar shape and it is formed by pressing the protective cover 31. The first supporting portion 311 has a first protrusion 3111. The first supporting portion 311 and the first protrusion 3111 are as a whole body. Two opposite sides of the protective cover 31 respectively extend at least one L shape fixing element 313. The L shape fixing element 313 of one side of two opposite sides of the protective cover 31 and the L shape fixing element 313 of the other side of two opposite sides of the protective cover 31 have inverse directions and they are deposed back to back. Two opposite sides of a control circuit board 32 respectively have at least one pierce hole 321. A back plate 33 has at least one second supporting portion 331, which is formed by pressing the back plate 33. The second supporting portion 331 has a second protrusion 3311. The second supporting portion 331 and the second protrusion 3311 are as a whole body. Furthermore, the back plate 33 has at least one fixing hole 332, which corresponds to the L shape fixing element 313. When the protective cover 31, a control circuit board 32 and the back plate 33 are fixed, the control circuit board 32 is deposed between the protective cover 31 and back plate 33. The first supporting portion 311 and the second supporting portion 331 oppositely support the control circuit board 32 that avoids the control circuit board 32 short due to a circuit area 324 of the control circuit board 32 touching with the protective cover 31 and the back plate 33. The first protrusion 3111 and the second protrusion 3311 oppositely wedge in the pierce hole 321 and two copper areas 322 respectively surround two ends of the pierce hole 321. Because the protective cover 31 and the back plate 33 are made of alloys, the two copper areas 322 respectively electrically connect with the first supporting portion 311 and the second supporting portion 331, so as to attain to ground connection to eliminate static electricity from the control circuit board 32.

Figure 9A:
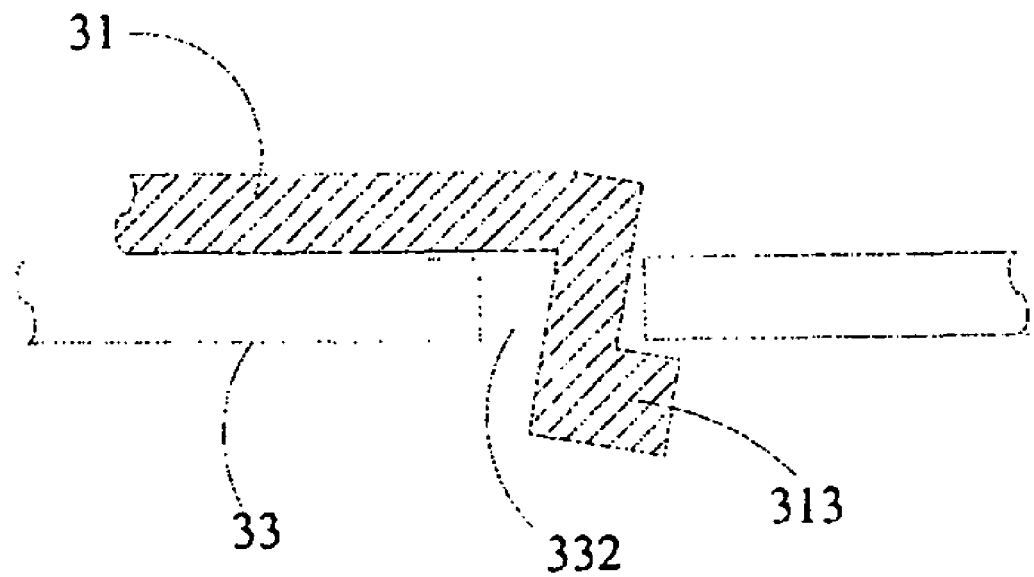
FIG. 9A is a schematic diagram of a L shape fixing element pressured and inserted in a fixing hole of the second preferred embodiment in the present invention.
Figure 9B:
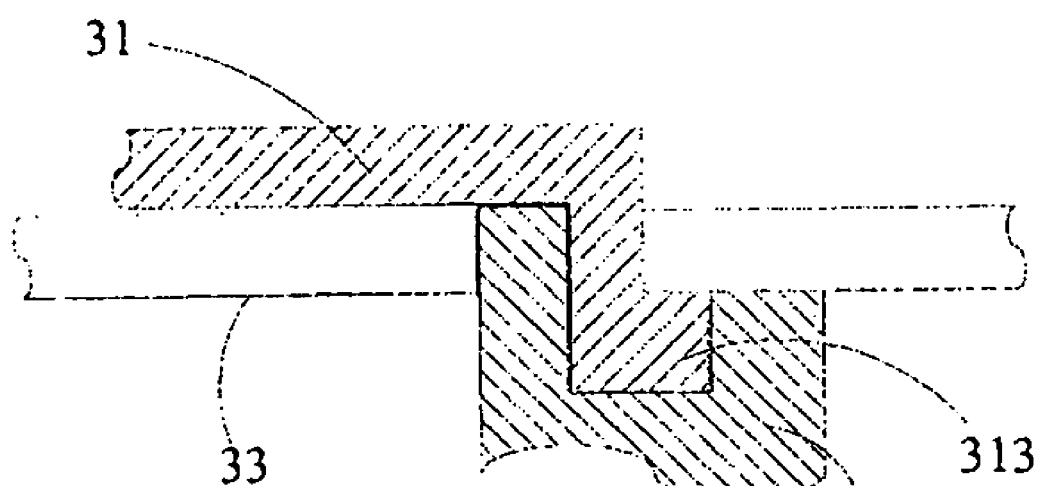
FIG. 9B is a schematic diagram of the L shape fixing element wedged in the fixing hole and a gap filled of the second preferred embodiment in the present invention.

Please refer to the FIG. 9A and FIG. 9B. When the protective cover 31, the control circuit board 32 and the back plate 33 are fixed, the ends of L shape fixing elements 313 of two opposite sides of the protective cover 31 are respectively pressed and inserted into the fixing holes 332 of two opposite sides of the back plate 33. Hence, the L shape fixing element 313 is wedged in the fixing holes 332. Then, a filling material 35 fills the gap to make the protective cover 31 and the back plate 33 fixed sufficiently.

The difference of second preferred embodiment and first preferred embodiment is that a control circuit board replaces the inverter. Because the control circuit board generates electromagnetic wave easier than the inverter, the first supporting portion in the second preferred embodiment is not a bridge shape. The first supporting portion 211 of the bridge shape generates the slot 212 and the slot 212 will leak the electromagnetic wave. Hence, the first supporting portion 311 is a pillar shape and directly formed on the protective cover 31, so as to avoid the electromagnetic wave's leakage.

Figure 10:
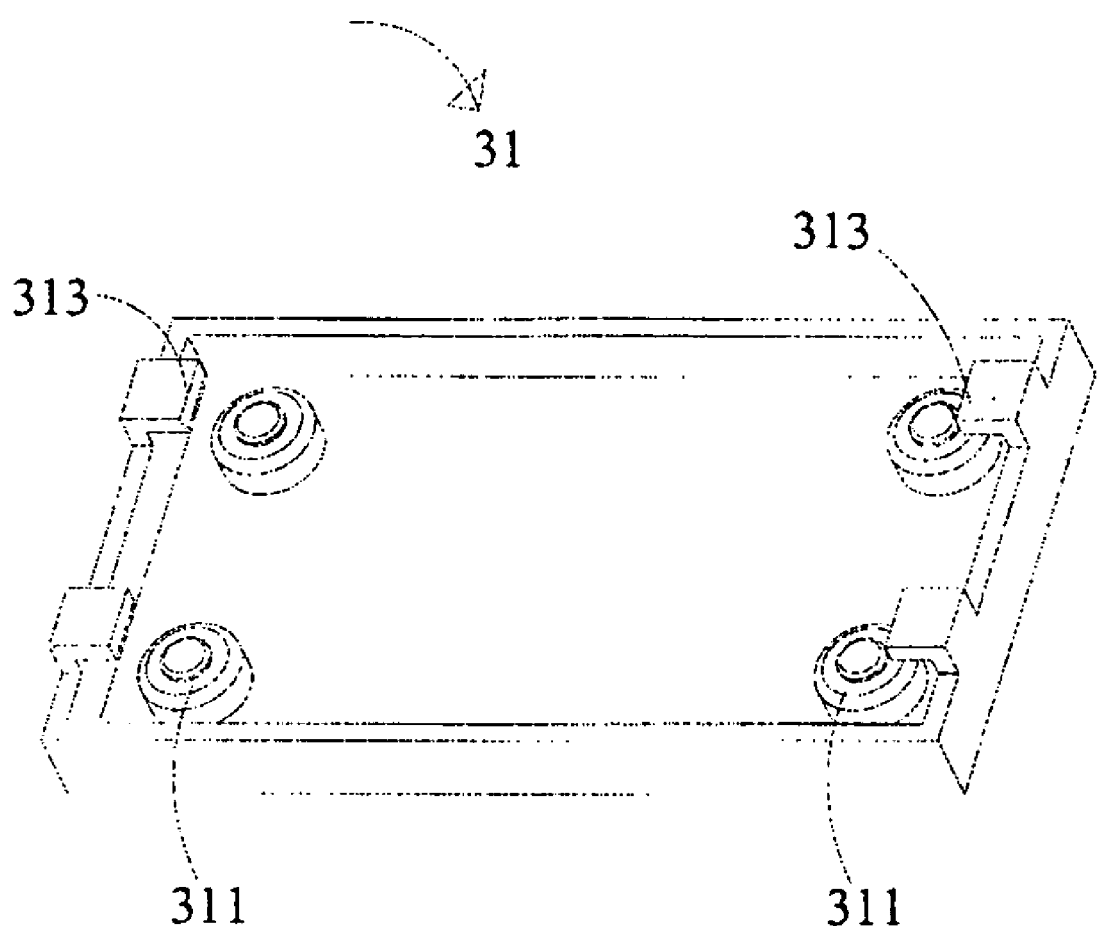
FIG. 10 is a drawing for the other protective cover of the second preferred embodiment in the present invention.

Please refer to the FIG. 10. The L shape fixing elements of one side of two opposite sides of the protective cover and the L shape fixing elements of the other side of two opposite sides of the protective cover can be deposed face to face. The remainder corresponding structure is the same foregoing structure. Hence, it is not described herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fixing structure for printed circuit board of backlight module, comprising:
    a protective cover, having at least one first supporting portion on its surface, the first supporting portion having a first protrusion;
    a printed circuit board having at least one pierce hole; and
    a back plate having at least one second supporting portion, the second supporting portion having a second protrusion;
    wherein the printed circuit board is deposed between the protective cover and the back plate, the first supporting portion and the second supporting portion oppositely support the printed circuit board, the first protrusion and the second protrusion oppositely wedge in the pierce hole and directly contact two ends of the pierce hole, and two copper areas respectively surround the two ends of the pierce hole and electrically connect with the first supporting portion and the second supporting portion.

2. The fixing structure for printed circuit board of backlight module as claimed in claim 1, wherein two opposite sides of the protective cover respectively extend at least one L shape fixing element, two opposite sides of the back plate have at least one fixing hole and the L shape fixing element wedge in the fixing hole.

3. The fixing structure for printed circuit board of backlight module as claimed in claim 2, further comprising a gap formed between the L shape fixing element and a wall of the fixing hole and a filling material filling the gap.

4. The fixing structure for printed circuit board of backlight module as claimed in claim 2, wherein the L shape fixing element of one side of two opposite sides of the protective cover and the L shape fixing element of the other side of two opposite sides of the protective cover have the same directions.

5. The fixing structure for printed circuit board of backlight module as claimed in claim 4, wherein after the L shape fixing element is inserted in the fixing hole, the protective cover is removed to make the L shape fixing element of the protective cover wedged in the fixing hole.

6. The fixing structure for printed circuit board of backlight module as claimed in claim 2, wherein the L shape fixing element of one side of two opposite sides of the protective cover and the L shape fixing element of the other side of two opposite sides of the protective cover have the inverse directions.

7. The fixing structure for printed circuit board of backlight module as claimed in claim 6, wherein the L shape fixing element of one side of two opposite sides of the protective cover and the L shape fixing element of the other side of two opposite sides of the protective cover are deposed face to face.

8. The fixing structure for printed circuit board of backlight module as claimed in claim 6, wherein the L shape fixing element of one side of two opposite sides of the protective cover and the L shape fixing element of the other side of two opposite sides of the protective cover are deposed back to back.

9. The fixing structure for printed circuit board of backlight module as claimed in claim 2, wherein the end of the L shape fixing element is pressed to wedge in the fixing hole.

10. The fixing structure for printed circuit board of backlight module as claimed in claim 1, wherein the printed circuit board is an inverter.

11. The fixing structure for printed circuit board of backlight module as claimed in claim 1, wherein the printed circuit board is a control circuit board.

12. The fixing structure for printed circuit board of backlight module as claimed in claim 1, wherein the first supporting portion is a bridge shape and a slot is formed between the first supporting portion and the surface of the protective cover.

13. The fixing structure for printed circuit board of backlight module as claimed in claim 1, wherein the first supporting portion is a pillar shape.

14. The fixing structure for printed circuit board of backlight module as claimed in claim 1, wherein the first supporting portion and the first protrusion are as a whole body.

15. The fixing structure for printed circuit board of backlight module as claimed in claim 1, wherein the second supporting portion and the second protrusion are as a whole body.

16. The fixing structure for printed circuit board of backlight module as claimed in claim 1, wherein the materials of the protective cover and the back plate are alloys.

* * * * *